US005780106A

United States Patent [19]

Conner

[11] Patent Number: 5,780,106
[45] Date of Patent: Jul. 14, 1998

[54] METHOD FOR LOW TEMPERATURE ALUMINUM COATING OF AN ARTICLE

[75] Inventor: Jeffrey A. Conner, Hamilton, Ohio

[73] Assignee: General Electric Company, Cincinnati, Ohio

[21] Appl. No.: 537,205

[22] Filed: Sep. 29, 1995

[51] Int. Cl.$^6$ ............................ C23C 16/12; C23C 16/18

[52] U.S. Cl. .................. 427/250; 427/252; 427/255.7; 427/124

[58] Field of Search ...................... 427/142, 250, 427/252, 124, 255.7

[56] References Cited

U.S. PATENT DOCUMENTS

| | | |
|---|---|---|
| 4,321,310 | 3/1982 | Ulion et al. . |
| 4,716,050 | 12/1987 | Green et al. ........................ 427/99 |
| 4,916,022 | 4/1990 | Solfest et al. ...................... 428/623 |
| 5,034,284 | 7/1991 | Bornstein et al. . |
| 5,137,426 | 8/1992 | Rhoda . |
| 5,217,756 | 6/1993 | Shinzawa . |
| 5,238,752 | 8/1993 | Duderstadt et al. . |
| 5,254,413 | 10/1993 | Maricocchi ........................ 428/633 |
| 5,403,669 | 4/1995 | Gupta et al. . |

OTHER PUBLICATIONS

Pierson, Hugh O. *Handbook of Chemical Vapor Deposition (CVD) Principles, Technology and Application*, 1992 p. 127.

*Primary Examiner*—Michael Lusignan
*Assistant Examiner*—Tammy Oreskovic
*Attorney, Agent, or Firm*—Andrew C. Hess; David L. Narciso

[57] ABSTRACT

A method is provided for coating a surface of an article with aluminum at a low temperature no greater than about 600° F. and less than a selected temperature exposure above which adversely can affect article integrity. The method includes providing an aluminizing vapor, for example a vapor of an organo-metallic material, which can decompose to substantially pure Al in a low decomposition temperature range. At least the portion of the surface to be coated is heated to the decomposition temperature range and then exposed to the vapor which decomposes and deposits a layer of Al on the surface portion. The Al then is diffused into the portion at a temperature consistent with other heat treatment of the article and which will not affect adversely properties and conditions previously introduced and desired to be retained in the article. The method is particularly useful in aluminizing a portion of an article surface associated with or near another portion which includes a thermal barrier coating, maintaining the integrity of the thermal barrier coating, such as its bond with a substrate coating.

6 Claims, No Drawings

METHOD FOR LOW TEMPERATURE ALUMINUM COATING OF AN ARTICLE

FIELD OF THE INVENTION

This invention relates to coatings on articles for use at high temperatures in an oxidizing environment, and, more particularly, in one form, to thermal barrier coated articles requiring additional protective treatment.

BACKGROUND OF THE INVENTION

High temperature operating components or articles, such as those used in the hot or turbine sections of gas turbine engines, require environmental protection to avoid damage to and reduction in operating life of the component. As gas turbine engine development evolved and advanced designs specified higher operating temperatures, associated coating development became more sophisticated and complex. One type of modern coating system is referred to as a thermal barrier coating, now widely described in the art. For example, one such system was discussed in U.S. Pat. No. 4,485,151—Stecura, issued Nov. 27, 1984, for protection of superalloy articles based on Ni, Co or Fe. Such a system, generally typical of other systems, includes an inner or bond type coating on the alloy substrate and an outer thermal barrier coating, such as a ceramic coating of zirconia at least partially stabilized with yttria. Other thermal barrier coating systems are reported in the following U.S. Pat. Nos.: 5,073,433—Taylor (issued Dec. 17, 1991); 5,238,752—Duderstadt et al (issued Aug. 24, 1993); 5,254,413—Maricocchi (issued Oct. 19, 1993); 5,350,599—Rigney et al (issued Sept. 27, 1994); and 5,403,669—Gupta et al (issued Apr. 4, 1995). The disclosure of each of the above identified patents hereby is incorporated herein by reference.

Due to the complexity of such thermal barrier coating systems, application of additional environmental protective coatings, such as standard or traditional relatively high temperature aluminizing, for example the commercially available Codep diffusion aluminide coating, over or near a thermal barrier coating (TBC) can result in degradation of the thermal barrier coating system, typically at the interface between the bond coat and the top ceramic type thermal barrier coating. In other cases, the protective coating is depleted or removed. Requirements for such an additional protective coating can arise from a number of events. The following examples are illustrative:

When an article, such as a gas turbine engine turbine nozzle, is manufactured or repaired, frequently individual nozzle segments are first coated with a TBC system and then assembled such as by brazing into the total article configuration. The brazed joint between segments does not include an environmental coating required for operation. High temperature aluminizing can affect adversely the bond coat/TBC interface.

In other instances, only local areas of an article require a TBC, with the TBC system bond coat being the protective coating for the other areas of the article. Application of the TBC, for example using grit blasting, preheating, TBC coating at elevated temperature, and post coating heat treatment can reduce significantly the Al content of the exposed bond coat area such as near or adjacent the TBC. Additional protective aluminizing is required.

In modern gas turbine engines, the amount of cooling air flowing through such components as blades and vanes is carefully controlled, in part by the size of cooling holes and passages. Reworking or repair of such air cooling holes or passages, which previously had been protected with an appropriate coating, can remove the coating. Coating replacement is required.

Exposure of insufficiently protected article surface portions can occur from such events as chipping during handling or repair after engine operation. Such repairs can include localized dimensional restoration, for example blade tip repair or replacement involving material removal, weld build-up, etc.

To avoid damage to or deterioration of an existing TBC system, a replacement protective coating method which maintains article or TBC coating integrity is desired.

SUMMARY OF THE INVENTION

The present invention provides a method for applying a coating of substantially pure Al to an article surface at a relatively low temperature of no greater than about 600° F., the article surface including a first portion having a protective first coating thereon and a second portion requiring a second additional coating. In one form, the method is practiced in order to avoid damage to a TBC system previously applied as a first coating to the article. Such form of the method is for coating an article surface including a first portion having a TBC deposited thereon and a second portion having substantially no, including insufficient, TBC thereon by aluminizing the second portion. The method comprises providing an aluminizing precursor, for example an organo-metallic material which can be vaporized, including being provided in a gaseous type condition. Then the precursor is decomposed to a vapor which can deposit pure Al by heating in a relatively low decomposition temperature range no greater than about 600° F. and less than a selected temperature, exposure above which adversely can affect article integrity, for example mechanical properties of the article or a brazed joint, bond coat/TBC interface, etc. Contact of that vapor with the second portion heated in the decomposition temperature range, for a sufficient coating time, deposits a layer of substantially pure Al at least on the second surface portion. Thereafter, the coated Al can be diffused into the second portion by heating the Al and the second surface portion at a diffusion temperature which is consistent with a heat treatment cycle used to make the article so as not to affect adversely article integrity.

DESCRIPTION OF THE PREFERRED EMBODIMENTS.

The application and use of various types of thermal barrier coatings are described in the above incorporated U.S. Patents. In particular, the disclosure of U.S. Pat. No. 5,254,413—Maricocchi addresses the problem of adding a coating which includes Al by using a coating source material comprising a mixture of a metallic source of Al and ceramic particles. Such a mixture does not include a halide activator frequently used in the art, such as that art relating to the commercially used Codep coating method, one form of which is more fully described in U.S. Pat. No. 3,667,985—Levine et al, issued Jun. 6, 1972, and other pack cementation type methods identified in the Maricocchi patent. One form of the invention of that patent coats a portion of the article at elevated temperatures so that a surface is aluminized by diffusion while the coating is applied.

As was mentioned above, in some applications of an over coating for the reasons discussed above, it was found that use of an elevated temperature diffusion cycle at the time of coating deposition can result in degradation of the interface between an existing bond coat and a TBC applied over the bond coat. According to a form of the present invention, degradation to such interface is avoided by applying substantially pure Al from an aluminizing precursor which will decompose to a vapor including substantially pure Al by heating in a decomposition temperature range no greater than about 600° F. and less than a selected temperature exposure above which adversely can affect article integrity. The phrase "substantially pure Al" herein is intended to mean pure Al which can include very minor amounts of impurities which do not affect function of the pure Al. After the low temperature application of such an Al over coating, the Al and the surface portion or substrate to which it was applied can then be heated at a temperature consistent with other specified heat treatment of the article during manufacture or repair to diffuse the Al into the substrate. For example, such heat treatment can be consistent with a brazing cycle or aging step, thus to avoid change in the conditions or properties intentionally developed in such events.

A preferred form of the present invention uses as an aluminizing precursor one, or a combination of, an organometallic material, or materials, which can be converted to or provided in the form of a vapor which decomposes to a vapor including substantially pure Al when heated at a low decomposition temperature in a range of no greater than about 600° F. Such materials for use as precursors are commercially available in a variety of forms including TEAL material, and TIBA material. Generally, these materials can provide a vapor which can decompose to substantially pure Al when heated in the range of about 350°–450° F., typically about 400° F., with the balance of the material becoming a non-reactive vapor or gas. After deposition, such Al can be diffused into the substrate to which it was applied.

Typical practice of the present invention generally includes preparation of a surface to be coated such as by surface cleaning and masking of nearby surfaces to which further coating is not intended to be applied. One advantage of the present invention is that simple, low temperature masking materials can be used because of the relatively low temperature used in the Al deposition. For example, aluminum or other foils or a simple, commercially available paint-on type of masking can be used.

After surface preparation, articles to be coated were placed in a coating chamber from which air was evacuated, as generally practiced in the art. Then the articles, including the surface to be coated, were heated in the chamber to a coating temperature which is in a decomposition temperature range for the aluminizing precursor to be used, no greater than about 600° F. and generally in the range of about 350°–400° F. The coating precursor was heated to and held at a temperature below its boiling point such that the vapor pressure of the precursor was controlled to yield a preselected concentration of precursor vapor in the gas flow into the coating chamber. This method was conducted to maintain a constant supply of coating source material into the coating chamber throughout the coating process. Then the precursor vapor was transported into the coating chamber by a carrier gas, such as argon or hydrogen. Upon contact with the unmasked surface of the articles at the decomposition temperature, the precursor vapor was decomposed thermally and deposited substantially pure Al on the surfaces to be coated (as well as on the masking and the chamber walls). After exposing the surface to the Al vapor for a coating time, typically in the range of about 1–3 hours, sufficient to deposit a layer of substantially pure Al to a desired thickness, the flow of precursor vapor into the chamber was terminated and the articles were cooled to room temperature. After removal of the articles from the chamber, any masking used was removed. Then the articles were placed in a standard heat treatment furnace for diffusion of the Al layer into the surface portion of the articles using a heat treatment cycle consistent with other standard, normally applied heat treatment used for the articles during manufacture or repair.

In one evaluation of the present invention, commercial gas turbine engine twin shank turbine blades, each including a platform, blade tips and surface connected cooling holes communicating with internal passages, were used. The blades were made of a commercially available Ni base superalloy called Rene' 80 alloy, more fully described in U.S. Pat. No. 3,615,376—Ross, issued Oct. 26, 1971. The blades had been externally diffusion aluminide coated with the above mentioned Codep coating on the flowpath surfaces, and a typical ceramic thermal barrier coating of zirconia stabilized with yttria was deposited on the leading and convex trailing edges by commercial physical vapor deposition. The objective of this evaluation was to determine the ability of the present invention to overaluminide the article surfaces, including the surfaces on which the TBC had been deposited, without damaging the TBC coating and its interface or bond with the aluminized substrate.

The blades were masked with a commercially available paint on masking to enable low temperature deposition of an Al coating from the precursor inside cooling holes, underneath the platform external surfaces and along the blade tip. These locations were selected to demonstrate the ability of the present invention to coat cooling holes (for example, as would be required to coat cooling holes on blades requiring cooling hole rework to meet airflow requirements), bare surfaces not coated by the initial bond coat process or from which bond coat had been removed, and blade tip areas (for example, as would be needed for a tip repair of damaged or engine run blades).

The blades were coated with a layer of substantially pure Al according to the method of the present invention described above using a commercially available material identified above as TEAL material as the precursor. With the blades loaded in the evacuated coating chamber, they were heated to about 200° C. (about 392° F.) and a vapor of the precursor contacted the blade surfaces including the cooling holes and associated passages, to deposit the Al layer. After cooling and removal from the chamber, masking was removed and the blades were heat treated to diffuse the Al coating into the surface to which it had been applied.

The blades thereafter were evaluated destructively to determine the acceptibility of masking of the regions previously treated with TBC, of coating deposition on identified regions, and of integrity of the TBC bond strength with the bond coat. The evaluation showed all to be acceptable.

The present invention provides a low coating temperature method which includes the ability to select, independently, the Al diffusion temperature which leaves intact the microstructual benefits associated with selected high temperature alloy heat treatments used with an article. Therefore, it can eliminate many complex and expensive high temperature heat treatments needed to redevelop required mechanical properties after coating. Also, the invention provides the ability to coat article surfaces into which cold work has been introduced, such as through shot peening to develop compressive stresses, without relieving such desirable stresses Fully assembled structures, for example gas turbine nozzles which had been annealed, or include brazed inserts, coverplates, or both and which had been brazed at temperatures below that used for standard high temperature aluminizing, can be coated according to the present invention while retaining structural integrity and properties. This invention enables coating of regions of assembled structures which include wear coatings that cannot be subjected to elevated temperature coating cycles or maskants used in such coating without damaging or degrading mechanical properties or coating integrity.

The present invention has been described in connection with various embodiments, examples and combinations. However, it will be understood by those skilled in the arts involved that this invention is capable of a variety of modifications, variations and amplifications without departing from its scope as defined in the appended claims.

I claim:

1. In a method for coating an article surface including a first portion having a protective first coating thereon and a second portion requiring a second coating thereon, a method for applying the second coating of the second portion comprising the steps of:

provilding an alunminizing precursor vapor which can decompose to an aluminizing vapor of substantially pure Al by heating at a first temperature in the range of about 350°–600° F., the first temperature being one at which the precursor vapor decomposes, one below a temperature that can diffuse a coating of substantially pure Al into the surface, and one less than a selected temperature greater than the first temperature and exposure at which can result in degradation of mechanical properties of the first coating and a bond of the first coating with the article surface;

placing the article surface in a coating chamber;

heating at least the second portion to the first temperature;

exposing at least the second portion to the precursor vapor for a coating time sufficient to deposit a layer of substantially pure Al to a preselected thickness on the second portion;

removing the article surface from the coating chamber; and then, heating at least the second portion, including the layer of Al deposited thereon, at a second, elevated Al diffusion temperature, sufficient to diffuse Al into the second portion to provide a protective coating, the second temperature being greater than the first temperature and less than the-selected temperature exposure at which can result in degradation of mechanical properties of the article and the first coating, to diffuse the Al into the second portion at the second temperature.

2. In the method of claim 1 for coating the second portion of a surface of an article in which the first portion has a thermal barrier coating deposited thereon and the second portion has substantially no thermal barrier coating thereon, in which:

the aluminizing precursor is an organo-metallic material; and, the aluminizing precursor vapor is provided by heating the organo-metallic material in a precursor vaporizing temperature range.

3. The method of claim 2 comprising the steps of:

providing an organo-metallic material as the aluminizing precursor;

heating the organo-metallic material in a precursor decomposition chamber in a precursor vaporizing temperature range to provide the precursor vapor;

heating at least the second portion of the surface of the article in a coating chamber in the precursor decomposition temperature range;

transporting the precursor vapor into the coating chamber;

exposing at least the second portion, heated in the precursor decomposition temperature range, to the precursor vapor for a coating time sufficient to decompose the precursor vapor and deposit the layer of substantially pure Al on the second portion; and then, heating at least the second portion at the Al diffusion temperature.

4. The method of claim 3 in which the precursor decomposition temperature range is about 350–450° F.

5. The method of claim 4 in which the coating time is in the range of about 1–3 hours.

6. The method of claim 4 in which the organo-metallic material is selected from the group consisting of triethyl aluminum (TEAL), tri-isobulyl aluminum (TIBA), and their mixtures.

* * * * *